United States Patent
Lu et al.

(10) Patent No.: US 7,994,073 B2
(45) Date of Patent: Aug. 9, 2011

(54) LOW STRESS SACRIFICIAL CAP LAYER

(75) Inventors: Jiong-Ping Lu, Richardson, TX (US); Periannan Chidambaram, Richardson, TX (US); Srinivasan Chakravarthi, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/940,433

(22) Filed: Nov. 15, 2007

(65) Prior Publication Data

US 2008/0064175 A1    Mar. 13, 2008

Related U.S. Application Data

(62) Division of application No. 11/383,721, filed on May 16, 2006.

(51) Int. Cl.
*H01L 21/31* (2006.01)
(52) U.S. Cl. ............ 438/791; 257/E21.12; 257/305
(58) Field of Classification Search .......... 438/174, 438/276, 289, 299–308, 530, 540, 554–567, 438/783, 757, 791, 766; 257/324, 325, 389, 257/760, E21.12, E21.374, E21.497
See application file for complete search history.

(56) References Cited

U.S. PATENT DOCUMENTS

| | | | | |
|---|---|---|---|---|
| 5,162,892 A | * | 11/1992 | Hayashi et al. | 257/65 |
| 5,827,769 A | * | 10/1998 | Aminzadeh et al. | 438/305 |
| 6,287,951 B1 | * | 9/2001 | Lucas et al. | 438/618 |
| 6,930,007 B2 | * | 8/2005 | Bu et al. | 438/289 |
| 2005/0059228 A1 | * | 3/2005 | Bu et al. | 438/595 |
| 2005/0170104 A1 | * | 8/2005 | Jung et al. | 427/569 |
| 2007/0037342 A1 | * | 2/2007 | Mehrad et al. | 438/230 |

OTHER PUBLICATIONS

Chen et al., Stress Memorization Technique (SMT) by Selectively Strained-Nitride Capping for Sub-65nm High Performance Strained-Si Device Applications, 2004 Symposium on VLSI Technology Digest of Technical Papers, pp. 56-57.

* cited by examiner

*Primary Examiner* — Thomas L Dickey
*Assistant Examiner* — Nikolay Yushin
(74) *Attorney, Agent, or Firm* — Rose Alyssa Keagy; Wade J. Brady, III; Frederick J. Telecky, Jr.

(57) ABSTRACT

A low stress sacrificial cap layer 120 having a silicon oxide liner film 130, a low stress silicon film 140, and a silicon nitride film. Alternatively, a low stress sacrificial cap layer 410 having a silicon oxide liner film 130 and a graded silicon nitride film 420. Also, methods 300, 500 for fabricating a transistor 20, 400 having a low stress sacrificial cap layer 120, 410.

18 Claims, 5 Drawing Sheets

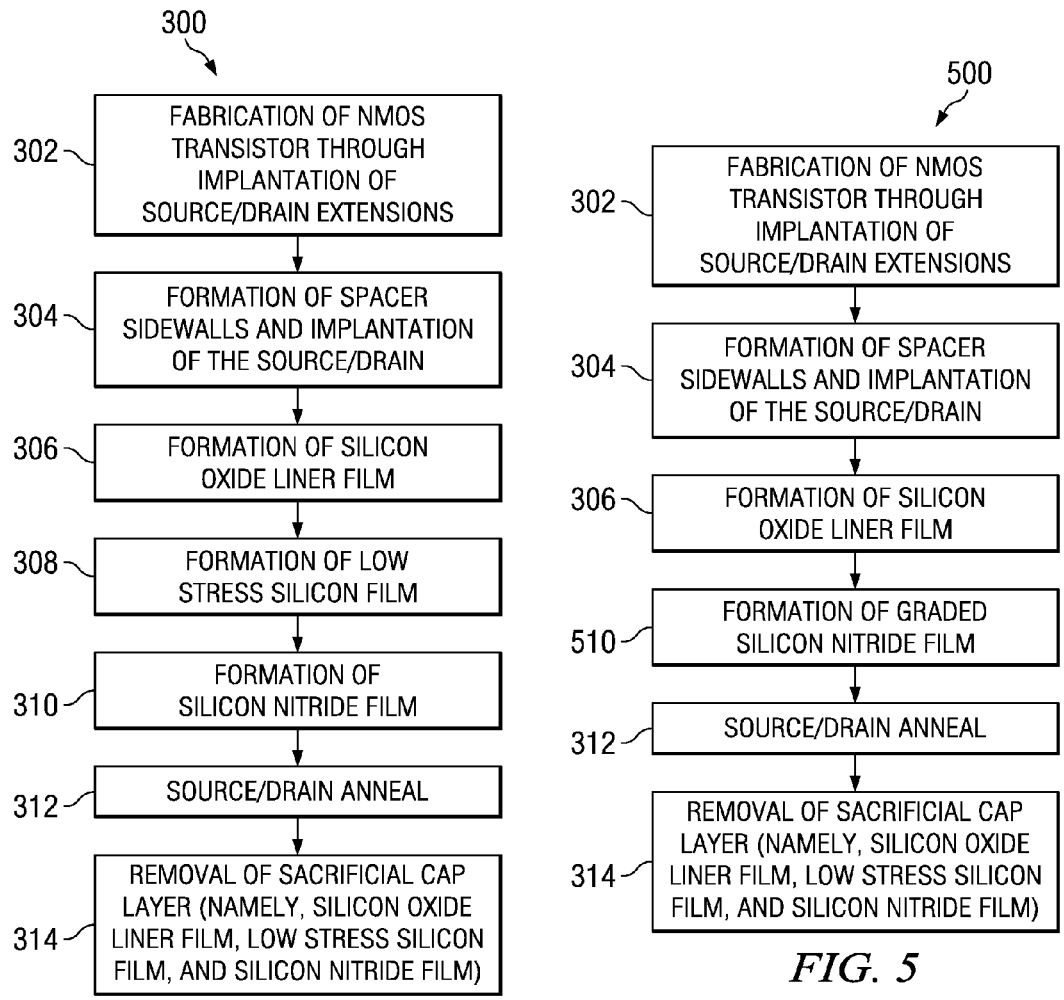
FIG. 3
FIG. 5
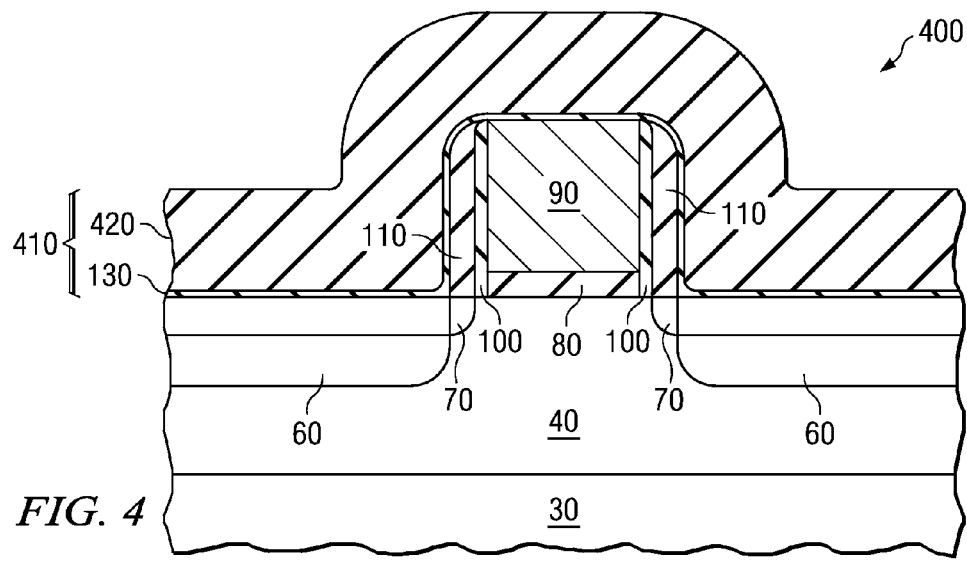
FIG. 4

LOW STRESS SACRIFICIAL CAP LAYER

This is a divisional application of Ser. No. 11/383,721 filed May 16, 2006.

BACKGROUND OF THE INVENTION

This invention relates to the fabrication of a semiconductor transistor using a low stress sacrificial cap layer.

BRIEF DESCRIPTION OF THE DRAWINGS

FIG. 3 is a flow chart illustrating the process flow of the invention.

FIG. 4 is a cross-sectional view of a semiconductor structure in accordance with an alternative embodiment of the present invention.

FIG. 5 is a flow chart illustrating the process flow of the alternative embodiment of the invention.

DETAILED DESCRIPTION OF THE INVENTION

Figure 1:
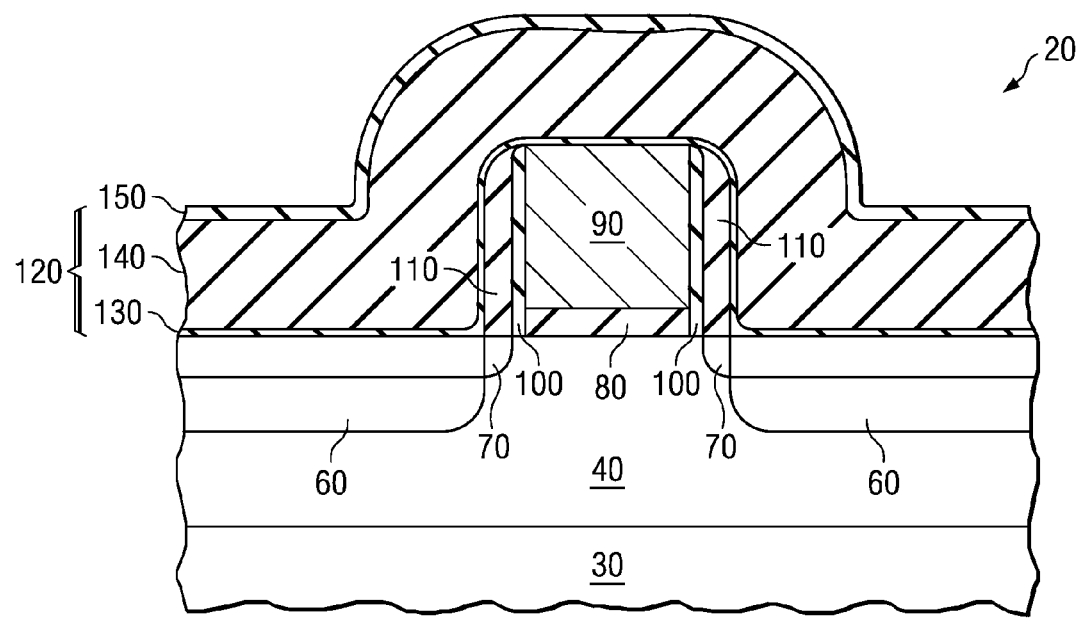
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor wafer 10 in accordance with the present invention. In the example application a partial NMOS transistor 20 is formed within a semiconductor substrate 30 having a well region 40. The remainder of the semiconductor wafer 10 may contain any combination of active or passive devices (not shown) such as additional CMOS. BiCMOS and bipolar junction transistors, capacitors, optoelectronic devices, inductors, resistors, and diodes.

The NMOS transistor structure 20 shown in FIG. 1 is used for the source/drain anneal step of the semiconductor wafer manufacturing process. In accordance with the invention, the NMOS transistor structure 20 has a low stress sacrificial cap layer 120 that is comprised of a silicon oxide liner film 130, a low stress silicon film 140, and a silicon nitride film 150. The silicon oxide liner film 130 generally has a thickness between 25-100 Å and it is approximately 50 Å thick in the example application. The low stress silicon film 140 may be any suitable film that contains both silicon and hydrogen, such as hydrogenated silicon or hydrogenated silicon nitride. In the example application, the low stress silicon film 140 is a hydrogenated silicon film that has a hydrogen level above 20%. It is believed that hydrogen levels above 20% improve the transistor drive current (through the removal of p-type dopants, such as boron, from the top of the channel region during the source/drain anneal). The low stress silicon film 140 has a thickness between 150-1500 Å and it is preferably about 800 Å thick. In accordance with the invention, the low stress silicon film 140 has a stress that is less than 300 mega Pascals ("MPa"), but preferably its less than 100 MPa. While not wishing to be tied to any particular theory, it is believed that device yield is improved by the use of the low stress silicon film 140. The silicon nitride film 150 is a silicon nitride film that is between 50-250 Å thick. It is believed that the silicon nitride film can improve the performance of the NMOS transistor 200 (e.g. improve the drive current for a specified level of off current).

The remaining portions of the NMOS transistor structure 20 shown in FIG. 1 may be those that are standard in the semiconductor industry. For example, the semiconductor substrate 30 is any semiconducting material that is doped with n-type and p-type dopants: however, it may be an amorphous silicon substrate, a substrate that is fabricated by forming an epitaxial silicon layer on a single-crystal substrate, or a substrate that is formed with a single crystalline silicon layer on an oxide layer on a single-crystal substrate (called an "SOI" structure). The active portion of the NMOS transistor 20 are generally the source/drain 60, the source/drain extensions 70, and the gate stack that is comprised of the gate dielectric 80 and the gate electrode 90.

In the example application shown in FIG. 1, the transistor 20 is an NMOS transistor. Therefore it is formed within an p-well region 40 of the semiconductor substrate 30. In addition, the deep source and drain 60 and the source and drain extension regions 70 have n-type dopants such as arsenic, phosphorous, antimony, or a combination of n-type dopants. The source/drain 60 is usually heavily doped, but the source/drain extension regions 70 may be lightly doped ("LDD"), medium doped ("MDD"), or highly doped ("HDD"). The NMOS gate stack is created from an n-type doped polysilicon gate electrode 90 and an oxide gate dielectric 80.

An offset structure comprising extension sidewalls 100 and spacer sidewalls 110 are used during fabrication to enable the proper placement of the source/drain extensions 70 and the sources/drain 60, respectively. More specifically, the source/drain extensions 70 are usually formed by using the gate stack 80, 90 and extension sidewalls 100 as a mask. In addition, the sources and drain 60 are usually formed with the gate stack and spacer sidewalls 110 as a mask.

Referring again to the drawings, FIGS. 2A-2H are cross-sectional views of a partially fabricated semiconductor wafer 10 illustrating a process for forming the source and drain 60 of an example NMOS transistor 20 in accordance with the present invention. FIG. 3 is a corresponding flow chart illustrating the process flow 300 of the invention.

Figure 2A:
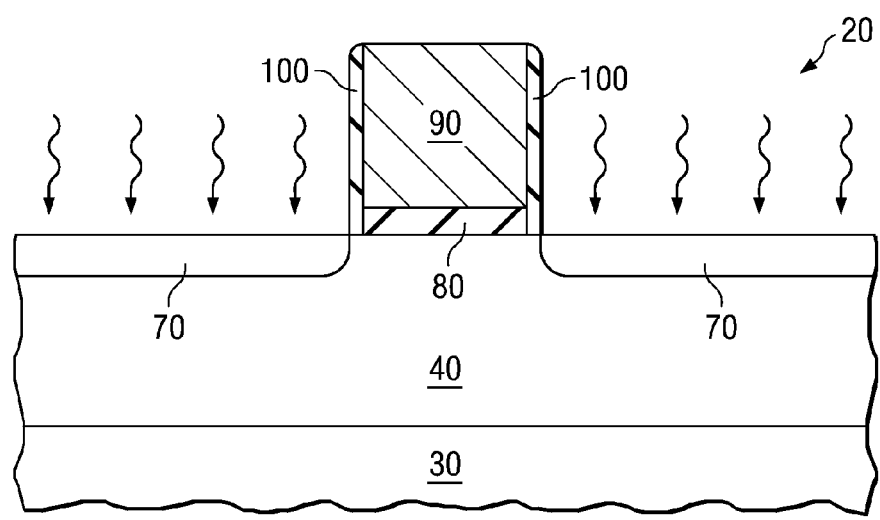
FIGS. 2A-2H are cross-sectional diagrams of a process for forming a transistor in accordance with the invention.

FIG. 2A is a cross-sectional view of an NMOS transistor 20 after the implantation of the dopant for the source/drain extensions 70 using any suitable process (step 302). For example, the extension regions 70 may be formed by low-energy ion implantation, gas phase diffusion, or solid phase diffusion. The dopants used to create the extension regions 70 for an NMOS transistor are n-type (i.e. phosphorous and arsenic).

Figure 2B:
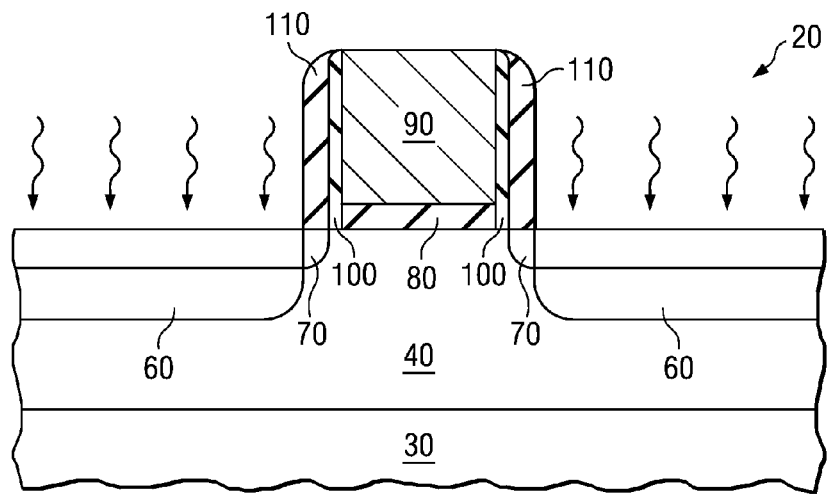

Referring to FIG. 2B, spacer sidewalls 110 are now formed proximate to the extension sidewalls 100 and the gate stack 80, 90. The extension sidewalls 100, and the spacer sidewalls 110 are then used as a template for the implantation of dopants into the source/drain regions 60 (step 304). The source/drain regions 60 may be formed through any one of a variety of standard processes, such as deep ion implantation or deep diffusion. The dopants used to create the source/drain regions 60 for an NMOS transistor are typically phosphorous and arsenic: however, other dopants or combinations for dopants may be used. The fabrication processes described in relation to FIGS. 2A-2B are only exemplary. The example NMOS transistor structure 20 shown in FIG. 2B may be formed using any know manufacturing process, such as the fabrication process described in the commonly assigned U.S. Pat. No. 6,930,007 (Ser. No. 10/662,850, filed Sep. 15, 2003; which is incorporated herein by reference and not admitted to be prior art with respect to the present invention by its mention in this section.

Figure 2C:
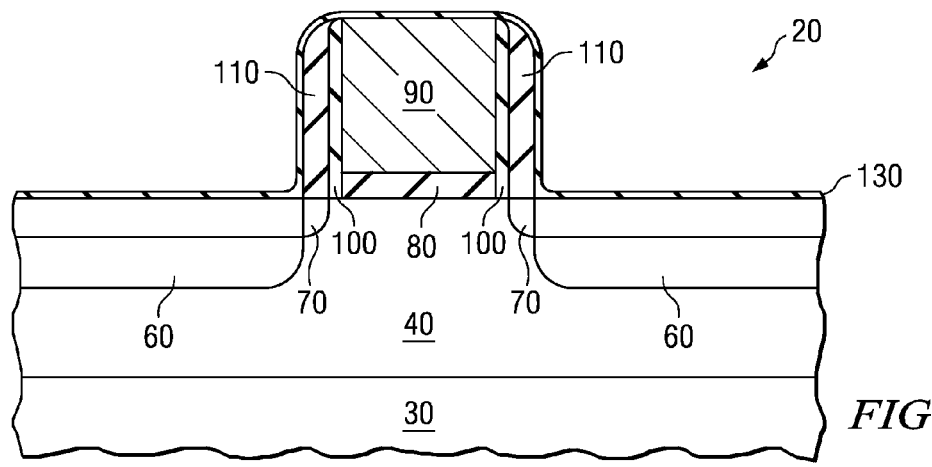

In accordance with the invention, a low stress sacrificial cap layer 120 is now formed over the semiconductor wafer 30. The first step is the formation of a silicon oxide liner film 130, as shown in FIG. 2C (step 306). The silicon oxide liner film 130 may be formed with any suitable process such as plasma enhanced chemical vapor deposition ("PECVD") and using any suitable machine such as the Centura (sold by AMAT). In the example application, the PECVD process uses a pressure of 1-30 Torr, a power level between 50-300 W, and a substrate temperature of 250-450° C. The silicon oxide film 130 may have a thickness of 25-100 Å and it is preferably less than 50 Å thick. The use of a thinner silicon oxide film 130 is believed to improve NMOS transistor drive current.

Figure 2D:
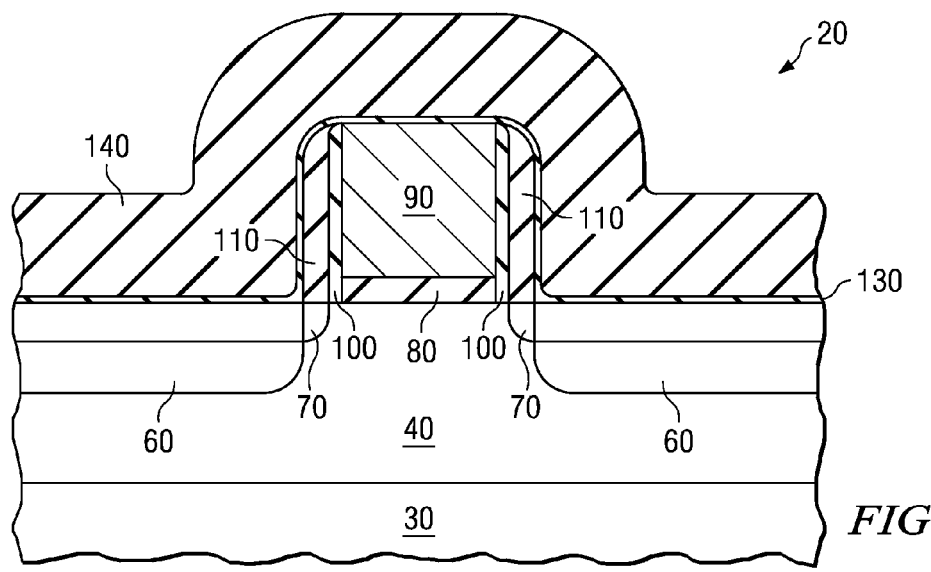

As shown in FIG. 2D, a low stress silicon film 140 is formed over the silicon oxide liner film 130 (step 308). In accordance with the invention, the low stress silicon film 140 has a stress that is less than 300 MPa. Preferably, the low stress silicon film 140 is less than 100 MPa. The low stress silicon film 140 may be formed in the same machine that was used for the formation of the silicon oxide film 130 (e.g. the Centura by AMAT); however any suitable machine and process may be used. In the example application, the PECVD process uses a pressure of 1-30 Torr, a power level between 50-300 W, and a substrate temperature of 250-450° C. The low stress silicon film 140 may have a thickness between 150-1500 Å without impacting device yield because the silicon film 140 has such a low stress level. In the example application, the low stress silicon film 140 has a thickness of approximately 800 Å.

Figure 2E:
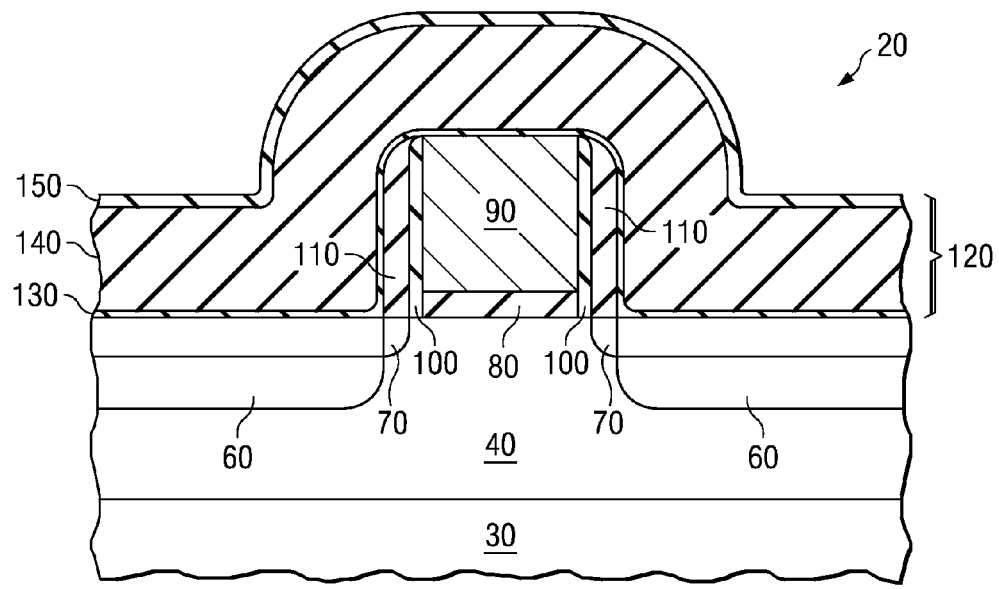

A silicon nitride film 150 is formed over the low stress silicon film 140 (step 310), as shown in FIG. 2E. In accordance with the invention, the silicon nitride film 150 is 50-250 Å thick, but it is preferably 100 Å thick. The silicon nitride film 150 is formed using a standard PECVD process with a suitable machine such as Centura by AMAT.

Figure 2F:
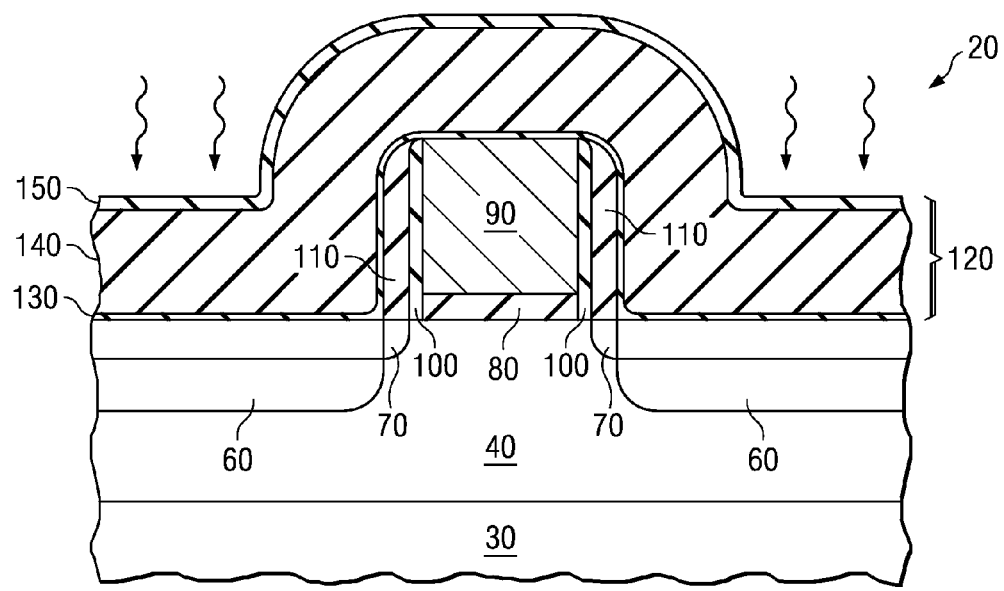

The next step in the fabrication process is a standard source/drain anneal, as shown in FIG. 2F (step 312). In the example application, the source and drain 60 plus the source/drain extensions 70 are activated by the anneal step 312. This anneal step acts to repair the damage to the semiconductor wafer during ion implants and to activate the dopants. The activation anneal may be performed by any technique such as rapid thermal annealing ("RTA"), flash lamp annealing ("FLA"), or laser annealing. This anneal step often causes lateral and vertical migration of dopants in the source/drain extension regions 70 and the sources/drain regions 60. In addition, this anneal step will cause the full crystallization of the ion implant areas 60, 70. If needed, a second anneal (which is generally similar to the first anneal) may be performed to promote the recrystallization of the ion implant areas 60, 70. It is to be noted that the stress level of the low stress silicon film 140 of the low stress sacrificial cap layer 120 is not increased by the source/drain anneal process 312.

Figure 2G:
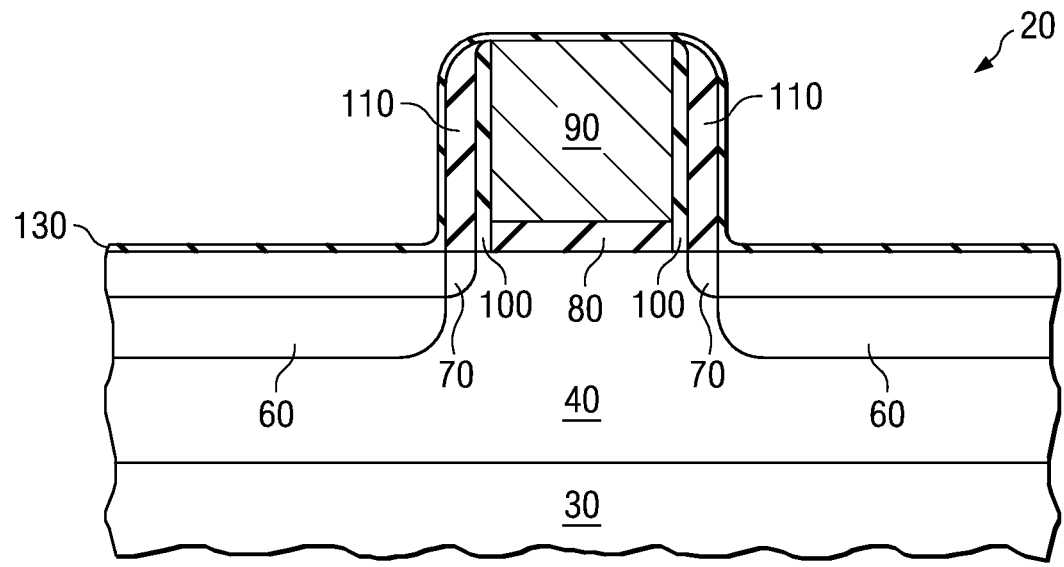
Figure 2H:
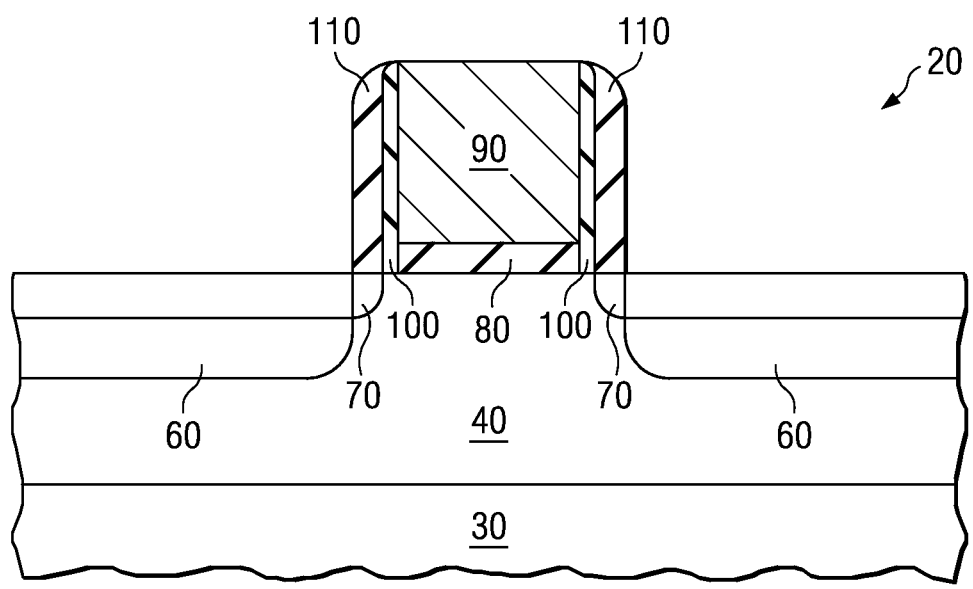

Once the anneal process 312 is complete, the low stress sacrificial cap layer 120 is removed (step 314). As shown in FIG. 2G, the silicon nitride film 150 and the low stress silicon film 140 are removed first (using the silicon oxide liner film as an etch stop layer). In the example fabrication process, the silicon nitride film 150 and the low stress silicon film 140 are removed with a standard selective etch such as a wet etch using not phosphoric acid etch ($H_3PO_4$) or a plasma dry etch (using a mixture of $Cl_2/HBr/He/O_2$). Then, as shown in FIG. 2H, the silicon oxide liner film 130 is removed with any suitable process such as a wet etch using a HF solution.

The fabrication of the semiconductor wafer 10 now continues with standard process steps until the semiconductor device is complete. Generally, the next step is the silicidation of the source/drain 60 and gate electrode 90, then the formation of the dielectric insulator layer and the contacts within the transistor layer of the integrated circuit. The semiconductor wafer fabrication then continues with the completion of the back-end structure that generally contains the metal interconnects for integrating the NMOS transistor 20 with the remainder of the integrated circuit. Once the fabrication process is complete, the integrated circuit will be tested and then packaged.

FIG. 4 is an alternative NMOS transistor structure 400 used during the source/drain anneal step 312 of the semiconductor wafer manufacturing process. Specifically, the structure shown in FIG. 4 replaces the structure shown in FIGS. 2E-2F. The alternative structure 400 has a low stress sacrificial cap layer 410 that contains the same silicon oxide liner film 130 plus a silicon nitride film 420 having a graded profile. The ratio of nitrogen to silicon is 0.0 closest to the oxide liner film 130 and it is stoichiometric at the top of the film 420. It is believed that the graded profile will allow the NMOS transistor 400 to be tuned for a targeted device performance without negatively impacting device yield. The silicon nitride film 420 may be formed by adjusting the precursor flow during the formation of the film so that the ratio of nitrogen to silicon changes from an initial ratio of 0.0 up to a final ratio of 1.33 (e.g. stoichiometry). Any suitable process such as PECVD (using a machine such as the Centura by AMAT) may be used to form the silicon nitride film 420. The thickness of the silicon nitride film 420 may range from 150-1500 Å, but it is preferably 800 Å thick. As shown in FIG. 5, the process flow of this alternative structure 400 is similar to the process flow shown in FIG. 3; however, step 510 replaces steps 308 and 310.

Various additional modifications to the invention as described above are within the scope of the claimed invention. As an example, additional anneal processes may be performed in the above-described fabrication process. For example, an anneal process may be performed after the implantation of the source/drain extensions 70 but before the implantation of the source/drain 60. When used, the anneal process can improve the microstructure of materials and thereby improve the quality of the semiconductor structure. Alternative low stress silicon films 140 having a stress level below 300 MPa are also within the scope of the invention. For example, the low stress silicon film 140 could also be a hydrogenated silicon nitride film having a hydrogen level above 20% that may improve the transistors drive current performance (i.e. have an improved ratio of drive current to off current). In addition, the silicon oxide liner film 130 may be comprised of other suitable materials such as oxynitride and it may even be omitted (if there is already silicon oxide covering the gate stack and other active surfaces prior to the deposition of the cap layer 120). Moreover, the low stress sacrificial cap layer 120 may be removed over PMOS devices prior to the source/drain anneal step 312 to avert any potential PMOS transistor degradation problems.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating a source and a drain of a transistor on a semiconductor wafer, comprising:
    performing a source/drain implant of said semiconductor wafer;
    forming a continuous silicon oxide liner film over said semiconductor wafer containing said source/drain implant;
    forming a continuous low stress silicon film over said continuous silicon oxide liner film, said continuous low stress silicon film having a stress level that is less than 300 MPa;
    forming a continuous silicon nitride film over said continuous low stress silicon film;
    performing a source/drain anneal after said step of forming said continuous silicon nitride film; and
    removing said continuous silicon nitride film, said continuous low stress silicon film, and said continuous silicon oxide liner film.

2. The method of claim 1 wherein said continuous low stress silicon film is hydrogenated silicon film.

3. The method of claim 1 wherein said continuous low stress silicon film is hydrogenated silicon nitride film.

4. The method of claim 1 wherein said continuous low stress silicon film has a thickness between 150-1500 Å.

5. The method of claim 1 wherein said continuous low stress silicon film is approximately 800 Å thick.

6. The method of claim 1 wherein said transistor is an NMOS transistor.

7. The method of claim 1 wherein said continuous silicon oxide liner film has a thickness between 25-100 Å.

8. The method of claim 1 wherein said continuous silicon oxide liner film is less than 50 Å thick.

9. A method for fabricating a source and a drain of a transistor on a semiconductor wafer, comprising:
    performing a source/drain implant of said semiconductor wafer;
    forming a continuous silicon oxide liner film over said semiconductor wafer containing said source/drain implant;
    forming a continuous graded silicon nitride film over said continuous silicon oxide liner film, said continuous graded silicon nitride film having a stress level that is less than 300 MPa and a graded nitrogen to silicon ratio of 0.0 closest to said continuous silicon oxide liner film to 1.33 closest to a top of said continuous qraded silicon nitride film;
    performing a source/drain anneal after said step of forming said continuous graded silicon nitride film; and
    removing said continuous graded silicon nitride film and said continuous silicon oxide liner film.

10. The method of claim 9 wherein said continuous graded silicon nitride film has a thickness between 150-1500 Å.

11. The method of claim 9 wherein said continuous graded silicon nitride film is approximately 800 Å thick.

12. The method of claim 9 wherein said transistor is an NMOS transistor.

13. The method of claim 9 wherein said continuous silicon oxide liner film has a thickness between 25-100 Å.

14. The method of claim 9 wherein said continuous silicon oxide liner film is less than 50 Å thick.

15. A method for fabricating a source and a drain of a transistor on a semiconductor wafer, comprising:
    performing a source/drain implant of said semiconductor wafer;
    forming a continuous graded silicon nitride film over said semiconductor wafer containing said source/drain implant, said continuous graded silicon nitride film having a stress level that is less than 300 MPa and a graded nitrogen to silicon ratio of 0.0 closest to said silicon oxide liner film to 1.33 closest to a top of said continuous qraded silicon nitride film;
    performing a source/drain anneal after said step of forming said continuous graded silicon nitride film; and
    removing said continuous graded silicon nitride film.

16. The method of claim 15 wherein said continuous graded silicon nitride film has a thickness between 150-1500 Å.

17. The method of claim 15 wherein said continuous graded silicon nitride film is approximately 800 Å thick.

18. The method of claim 15 wherein said transistor is an NMOS transistor.

* * * * *